(12) United States Patent
Muramatsu et al.

(10) Patent No.: US 8,115,300 B2
(45) Date of Patent: Feb. 14, 2012

(54) WIRING SUBSTRATE AND MANUFACTURING METHOD THEREOF, AND SEMICONDUCTOR APPARATUS

(75) Inventors: Shigetsugu Muramatsu, Nagano (JP); Tsuyoshi Kobayashi, Nagano (JP); Takashi Kurihara, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 319 days.

(21) Appl. No.: 11/763,053

(22) Filed: Jun. 14, 2007

(65) Prior Publication Data
US 2007/0290306 A1    Dec. 20, 2007

(30) Foreign Application Priority Data

Jun. 19, 2006  (JP) ................. 2006-168360
Feb. 13, 2007  (JP) ................. 2007-032106

(51) Int. Cl.
*H01L 23/12* (2006.01)

(52) U.S. Cl. ........ 257/700; 257/698; 257/724; 257/737; 257/753; 257/778; 257/782; 257/783

(58) Field of Classification Search .................. 257/698, 257/700, 723, 724, 737, 753, 778, 782, 783
See application file for complete search history.

(56) References Cited

U.S. PATENT DOCUMENTS

| | | | | |
|---|---|---|---|---|
| 4,708,770 A | * | 11/1987 | Pasch | 438/453 |
| 5,116,459 A | * | 5/1992 | Kordus et al. | 216/20 |
| 5,116,463 A | * | 5/1992 | Lin et al. | 216/18 |
| 5,219,787 A | * | 6/1993 | Carey et al. | 438/637 |
| 5,236,551 A | * | 8/1993 | Pan | 216/19 |
| 5,436,411 A | | 7/1995 | Pasch | |
| 6,593,224 B1 | | 7/2003 | Lin | |
| 2006/0223303 A1 | | 10/2006 | Kurasawa | |

FOREIGN PATENT DOCUMENTS

| | | |
|---|---|---|
| JP | 1-233075 | 9/1989 |
| JP | 11-126974 | 5/1999 |
| JP | 2000-188449 | 7/2000 |
| JP | 2002-324819 | 11/2002 |

* cited by examiner

*Primary Examiner* — N Drew Richards
*Assistant Examiner* — Joannie A Garcia
(74) *Attorney, Agent, or Firm* — Rankin, Hill & Clark LLP

(57) ABSTRACT

In a semiconductor apparatus, a semiconductor element is mounted on a wiring substrate. Wiring patterns and protrusions are formed on a surface of a substrate with the wiring patterns extending on tops of the protrusions. The surface of the substrate on which the wiring patterns are formed are covered with an insulating layer. Surfaces of connection parts of the wiring patterns formed on the tops of the protrusions are formed with the surfaces of the connection parts exposed to a surface of the insulating layer on a level with the surface of the insulating layer or in a position lower than the surface of the insulating layer. The connection parts are formed as pads for connection formed in alignment with connection electrodes of the semiconductor element. The semiconductor element is mounted by making electrical connection to the connection parts by flip chip bonding.

6 Claims, 10 Drawing Sheets

WIRING SUBSTRATE AND MANUFACTURING METHOD THEREOF, AND SEMICONDUCTOR APPARATUS

This application claims priorities from Japanese Patent Application No. 2006-168360, filed Jun. 19, 2006 and Japanese Patent Application No. 2007-032106, filed Feb. 13, 2007 in the Japanese Patent Office. The priority applications are incorporated by reference in its entirety.

TECHNICAL FIELD

The present disclosure relates to a wiring substrate and a manufacturing method thereof, and a semiconductor apparatus. More specifically, the present disclosure relates to a wiring substrate characterized by an electrical connection structure between wiring layers and a manufacturing method thereof, and a semiconductor apparatus using this wiring substrate.

RELATED ART

In a multilayer wiring substrate for laminating and forming wiring layers through an insulating layer, a method for making connection by forming a via hole in an insulating layer and plating the via hole and forming a conduction part (via) of a wiring pattern is used as a method for electrically connecting wiring patterns between the wiring layers.

FIGS. 9A to 9E show formation steps by a build-up method as an example of a manufacturing method of a multilayer wiring substrate. FIG. 9A is a state of forming an insulating layer 14 so as to cover the whole surface of a substrate after a wiring pattern 12 is formed on a surface of an underlaying layer 10. The insulating layer 14 is formed by laminating, for example, an epoxy resin film. Next, via holes 14a are formed in the insulating layer 14 in alignment with a region of electrically connecting the wiring pattern between layers and then electroless copper plating is performed with respect to the substrate and a plated seed layer 16 is formed on a surface of the insulating layer 14 (FIG. 9B).

Then, a resist pattern 18 is formed on the surface of the insulating layer 14 so as to expose a region used as the wiring pattern (FIG. 9C). Then, electrolytic copper plating using the plated seed layer 16 as a plated power supplying layer is performed and copper plating 20 is deposited on an exposed surface of the plated seed layer 16 (FIG. 9D). FIG. 9E shows a state in which the resist pattern 18 is removed and then the portion of the plated seed layer 16 exposed to the surface of the insulating layer 14 is removed and a wiring pattern 22 is formed as an independent pattern.

The copper plating 20 with which the via holes 14a are filled becomes vias 20a for making electrical connection between the wiring pattern 12 of a lower layer and the wiring pattern 22 of an upper layer. It becomes a state in which the wiring pattern 12 of the lower layer is electrically connected to the wiring pattern 22 of the upper layer through the vias 20a.

[Patent Reference 1] Japanese Patent Unexamined Publication No. 2003-218516.

The manufacturing method of the wiring substrate shown in FIGS. 9A to 9E shows a method for laminating an insulating resin and forming via holes and then forming a wiring pattern by a semi-additive method. In addition to this method, a manufacturing method of the wiring pattern includes methods such as an additive method or a subtractive method.

When the via holes 14a are formed in the insulating layer 14 in these manufacturing steps, the via holes 14a are formed by laser machining, but a processing method of the via holes 14a by this laser machining has some problem. This is because machining of a laser machine is expensive and the number of via holes formed in the insulating layer is extremely large since an arrangement density of a wiring pattern in a recent wiring substrate becomes high.

Also, in the case of a method for forming via holes in an insulating layer and electrically connecting a wiring pattern between layers by vias, there is a problem of inhibiting the wiring pattern from being arranged at a high density. In the case of connecting the wiring pattern through the vias, it is necessary to form a connection pad with a diameter larger than an opening diameter of the via hole in the portion of connection between the via and the wiring pattern, with the result that increasing a wiring density is restricted.

FIG. 10A shows a sectional configuration of a region in which the via hole 14a is formed in the insulating layer 14 and the wiring pattern 12 of the lower layer is connected to the wiring pattern 22 of the upper layer by a via 21. FIG. 10B shows planar arrangement of the via hole 14a and a pad 22a formed in the wiring pattern 22 of the upper layer. FIG. 10C shows planar arrangement of a pad 12a in the via hole 14a of the wiring pattern 12 of the lower layer. The reason why the pad 22a is formed in a diameter larger than that of the via hole 14a is because reliability of connection in the via hole portion is ensured in consideration of processing variations.

When the pad for connection is formed in the connection portion of the wiring pattern, an arrangement distance between routed wires 22b is restricted by arrangement of pads 22a even when the routed wires 22b of the wiring pattern are formed in thin width as shown in FIGS. 11A, 11B. FIG. 11A is the case of aligning the pads 22a in a line, and FIG. 11B is an example of arranging the pads 22a in a staggered state. Also, in a region in which the pads 22a are not arranged intensively, the routed wires 22b are detoured and formed so as not to interfere with the pads 22a, so that a length of the wiring pattern becomes long. Also, there is a problem that electrical characteristics of wiring deteriorate when there is a wide portion like the pad for connection in the middle of wiring.

In addition, products in which semiconductor elements are mounted by flip chip bonding have been heavily used in a recent semiconductor apparatus. In these products, an operation of filling a gap between a semiconductor element and a wiring substrate with an underfill resin after flip chip bonding between the semiconductor element and the wiring substrate is made is performed. However, a gap distance between the semiconductor element and the wiring substrate becomes narrow as connection pads of the semiconductor element become more, so that it becomes difficult to perform the operation of filling the gap between the semiconductor element and the wiring substrate with the underfill resin.

A semiconductor element mounting surface of a related-art wiring substrate is formed by forming a wiring pattern on a surface of a substrate and then covering the surface of the substrate with a protective film such as a solder resist and exposing a pad part of the wiring pattern in alignment with planar arrangement of a terminal (bump) of a semiconductor element mounted in the wiring substrate. As a result of this, the pad part formed on the semiconductor element mounting surface of the wiring substrate is formed much lower than a surface of the protective film such as the solder resist, and unevenness is formed on the semiconductor element mounting surface of the wiring substrate. As a result of this, fluidity of an underfill resin in the case of performing an underfill after flip chip bonding between the semiconductor element and the wiring substrate is made is obstructed and it becomes a cause in which the accurate underfill is not performed.

SUMMARY

Exemplary embodiments of the present invention provide a wiring substrate capable of accurately performing an underfill of a semiconductor element mounted by flip chip bonding and also forming a wiring pattern at a high density by electrically connecting the wiring patterns between layers without using a method for forming a via hole, a manufacturing method of the wiring substrate, and a semiconductor apparatus using this wiring substrate.

A wiring substrate according to a first exemplary embodiment of the present invention comprises:

a substrate;

a protrusion formed on a surface of the substrate;

a wiring pattern formed on the surface of the substrate by extending wiring onto a top of the protrusion; and an insulating layer covering the surface of the substrate on which the wiring pattern is formed, wherein a surface of a connection part of the wiring pattern disposed on the top of the protrusion is exposed to a surface of the insulating layer and the surface of the connection part is on a level with the surface of the insulating layer or in a position lower than the surface of the insulating layer.

A wiring substrate according to a second exemplary embodiment of the present invention comprises:

a lower layer having a first insulating layer used as an underlaying layer, a protrusion formed on a surface of the underlaying layer, and a wiring pattern formed on the surface of the underlaying layer by extending wiring onto a top of the protrusion;

an upper layer having a wiring pattern, the wring pattern of the upper layer making electrical connection with the wiring pattern of the lower layer; and a second insulating layer through which the wiring pattern of the lower layer and the wiring pattern of the upper layer are laminated with each other, the second insulating layer covering a surface of the lower layer on which the wiring pattern is formed, wherein a surface of a connection part of the wiring pattern of the lower layer disposed on the top of the protrusion is exposed to a surface of the second insulating layer and the surface of the connection part is on a level with the surface of the second insulating layer or in a position lower than the surface of the second insulating layer, and wherein the wiring pattern of the upper layer is electrically connected to the exposed connection part of the wiring pattern of the lower layer A wiring substrate according to a third exemplary embodiment of the present invention is that in the wiring substrate according to the second exemplary embodiment, the wiring pattern of the lower layer and the wiring pattern of the upper layer are disposed in a configuration of mutually connecting plural wiring patterns or a configuration of connecting a single wiring pattern to plural wiring patterns in the top of the protrusion.

Therefore, flexibility in a connection form of the wiring pattern between layers can be improved and design of the wiring pattern can be facilitated.

A wiring substrate according to a fourth exemplary embodiment of the present invention is that in the wiring substrate according to the first to third exemplary embodiments, the top of the protrusion is formed in a flat surface.

Therefore, the wiring pattern of the lower layer can easily be connected to the wiring pattern of the upper layer.

A wiring substrate according to a fifth exemplary embodiment of the present invention is that in the wiring substrate according to the first to fourth exemplary embodiments, a side surface of the protrusion is formed in an inclined surface and the wiring pattern extends to the connection part through the inclined surface.

Therefore, electrical connectivity between the wiring pattern and the connection part can surely be ensured.

A wiring substrate according to a sixth exemplary embodiment of the present invention is that in the wiring substrate according to the first to fifth exemplary embodiments, a height of step difference between the surface of the insulating layer and the surface of the connection part be 5 μm or less.

A manufacturing method of a wiring substrate according to a seventh exemplary embodiment of the present invention comprises the steps of:

forming a protrusion on a surface of a substrate;

forming a wiring pattern on the surface of the substrate on which the protrusion is formed by extending wiring onto a top of the protrusion;

covering the surface of the substrate on which the wiring pattern is formed with an insulating layer; and exposing a surface of a connection part of the wiring pattern disposed on the top of the protrusion to a surface of the insulating layer so that the surface of the connection part is on a level with the surface of the insulating layer or in a position lower than the surface of the insulating layer.

A manufacturing method of a wiring substrate including a lower layer having a wiring pattern and an upper layer having a wiring pattern which makes electrical connection with the wiring pattern of the lower layer according to an eighth exemplary embodiment of the present invention comprises the steps of:

forming a protrusion on a surface of a first insulating layer used as an underlaying layer of the lower layer;

forming the wiring pattern of the lower layer on the surface of the first insulating layer on which the protrusion is formed by extending wiring onto a top of the protrusion;

covering the surface of the first insulating layer on which the wiring pattern of the lower layer is formed with a second insulating layer;

exposing a surface of a connection part of the wiring pattern of the lower layer disposed on the top of the protrusion to a surface of the second insulating layer so that the surface of the connection part is on a level with the surface of the second insulating layer or in a position lower than the surface of the second insulating layer; and forming the wiring pattern of the upper layer on the second insulating layer by making electrical connection the wiring pattern of the upper layer to the connection part of the wiring pattern of the lower layer.

A semiconductor apparatus according to a ninth exemplary embodiment of the present invention comprises:

a wiring substrate;

a semiconductor element or a semiconductor device mounted on the wiring substrate, wherein the wiring substrate includes a substrate; a protrusion formed on a surface of the substrate; a wiring pattern formed on the surface of the substrate by extending wiring onto a top of the protrusion; and an insulating layer covering the surface of the substrate on which the wiring pattern is formed, wherein a surface of a connection part of the wiring pattern disposed on the top of the protrusion is exposed to a surface of the insulating layer and the surface of the connection part is on a level with the surface of the insulating layer or in a position lower than the surface of the insulating layer, and wherein the semiconductor element or the semiconductor device makes electrical connection to the connection part of the wiring pattern of the wiring substrate.

The connection part may be formed as a pad for connection formed in alignment with a connection electrode of the semiconductor device or the semiconductor element, and the semiconductor element or the semiconductor device may be mounted by making electrical connection to the connection part by a connection terminal.

Also, the connection part may be formed as a bonding pad connected to the semiconductor element by wire bonding, and a connection electrode of the semiconductor device or the semiconductor element may be mounted by making connection to the connection part by bonding wire.

One or more exemplary embodiments of the present invention may include one or more the following advantages. For example, according to a wiring substrate according to the present invention and a manufacturing method thereof, by adopting a configuration in which a protrusion is formed on a substrate or an insulating layer and a wiring pattern is electrically connected between layers, manufacturing steps of the wiring substrate can be simplified and manufacture of the wiring substrate can be facilitated. Also, by electrically connecting the wiring pattern between layers in a connection part formed on the protrusion, the wiring pattern can be formed at a higher density than a method for connecting a wiring pattern using a via hole. Also, by disposing a surface of the connection part disposed on a top of the protrusion on a level with a surface of the insulating layer or in a position lower than the surface of the insulating layer, filling characteristics of an underfill resin can be improved in the case of making flip chip bonding between a semiconductor element and the wiring substrate and performing an underfill. Also, in a semiconductor apparatus according to the present invention, a semiconductor element or a semiconductor device can surely be mounted in the wiring substrate by wire bonding or a connection terminal such as a solder bump and manufacture of the semiconductor apparatus is facilitated and it can be provided as the semiconductor apparatus with high reliability.

Other features and advantages may be apparent from the following detailed description, the accompanying drawings and the claims.

DETAILED DESCRIPTION

Exemplary embodiments of the present invention will be described below in detail with reference to the accompanying drawings.

(Manufacturing Method of Wiring Substrate)

FIGS. 1A to 3F show steps of forming a wiring pattern in a core substrate 30 as a manufacturing step example of a manufacturing method of a wiring substrate according to the present invention, and show sectional views of the substrate in each of the steps.

Figure 1A:
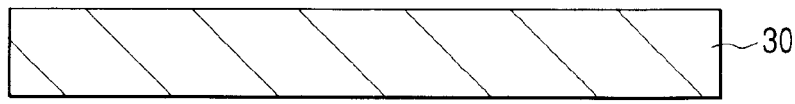
FIGS. 1A to 1G are sectional views of a substrate in manufacturing steps of a wiring substrate according to the present invention.

FIG. 1A shows the core substrate 30 for forming the wiring pattern. As the core substrate 30, for example, a resin substrate made of glass epoxy can be used. The core substrate 30 normally comprises plural wiring layers, and a through hole is formed in order to bring these wiring layers into electrical conduction. In the drawings, these configurations are omitted.

Figure 1B:
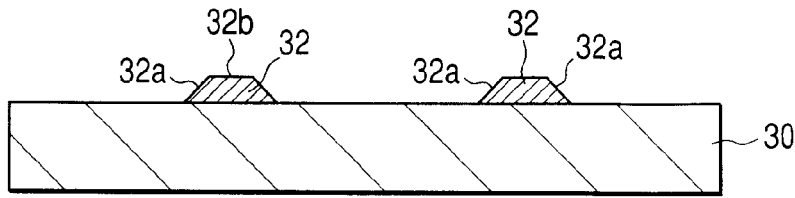

FIG. 1B shows a state of forming protrusions 32 on a surface of the core substrate 30. This protrusion 32 is formed so as to become higher than a thickness of the wiring pattern formed on the surface of the core substrate 30 in alignment with a planar arrangement position in which the wiring pattern is electrically connected between layers.

Figure 2A:
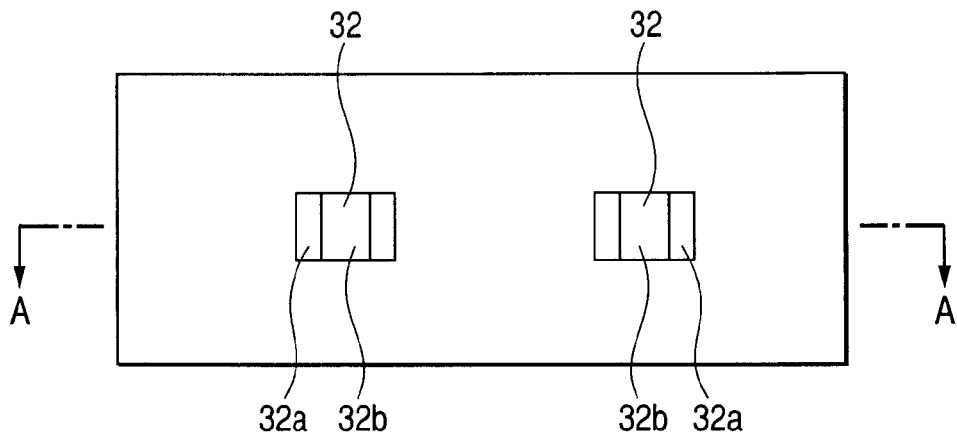
FIGS. 2A to 2C are plan views of wiring patterns and protrusions formed on a core substrate.

FIG. 2A shows a plan view (FIG. 1B is a sectional view taken on line A-A of FIG. 2) of a state of forming the protrusions 32 on the surface of the core substrate 30. In the present embodiment, the protrusion 32 is formed so that the planar shape is a rectangle and the side surfaces 32a are inclined surfaces and the top 32b is a flat surface. Since the wiring pattern is formed so as to extend wiring to the side surfaces 32a and the top 32b, a width of the protrusion 32 is formed slightly wider than a pattern width of the wiring pattern.

The manufacturing steps of the wiring substrate of the exemplary embodiment are characterized by a step of forming the protrusions 32 on the surface of the core substrate 30. In the actual manufacturing step, the protrusions 32 (with trapezoidal cross-section in the exemplary embodiment) are formed on the surface of the core substrate 30 (work) formed in a large size.

As a method for forming the protrusions 32, a formation method by a printing method such as a screen printing using a pasty resin, a formation method for transferring a resin formed on a peel sheet in predetermined arrangement to the core substrate 30, a formation method for spraying a resin on the core substrate 30 by an ink jet, a formation method for dispensing a resin, etc. can be used. The cases by the printing method and the transfer method are effective since the protrusions 32 can be efficiently formed on large-sized work.

Also, the protrusion 32 can be formed so as to be bulged on the surface of the core substrate 30 by an imprint method. An imprint mold used herein is means in which a region for forming the protrusion 32 is formed in a recess, and the surface of the core substrate 30 is covered with a resin thin film for mold release and the imprint mold is pressed on the surface of the core substrate 30 and thereby, the surface of the core substrate 30 is plastically deformed and the protrusion 32 can be formed.

Also, a method for covering the surface of the core substrate 30 with a resin protect film such as a dry film that predetermined patterns are formed and then performing processing so as to leave the protrusion 32 by a sand blast method can be used.

Also, it can be constructed so as to cover the surface of the core substrate 30 with a photosensitive resin film and expose and develop the surface in a predetermined pattern and leave the protrusion 32.

In addition, these methods forming the protrusions 32 on the surface of the core substrate 30 are not limited to a wiring substrate with a single-layer structure, and can be just similarly applied to the case of forming protrusions on an insulating layer used as an underlay when a multilayer wiring substrate for forming a wiring pattern in multi layers is formed.

A thickness of the wiring pattern is about 15 μm and the protrusion 32 formed on the surface of the core substrate 30 could be formed in a height of about 20 to 30 μm, so that the protrusion can be formed simply by the printing method, the transfer method, the imprint method, the sand blast method, a photo process, etc.

Figure 1C:
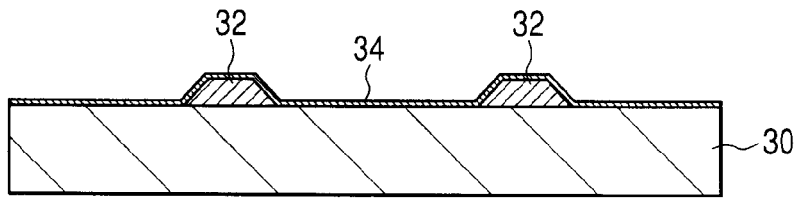

FIG. 1C shows a state in which a plated seed layer 34 is formed on a surface of work after the protrusions 32 are formed on the surface of the core substrate 30. The plated seed layer is formed by a sputtering method or a method for performing electroless copper plating on the surface of work. The plated seed layer is a layer used as a power supplying layer in the case of electrolytic plating and could be formed in a thickness necessary for plating power supplying.

Figure 1D:
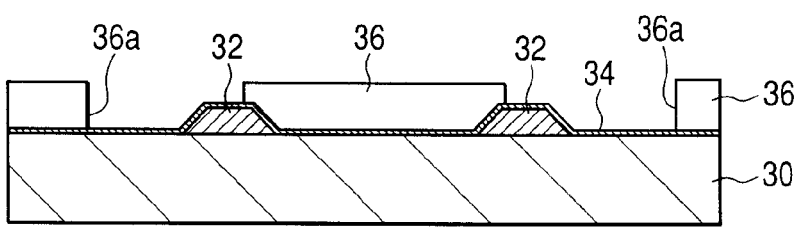

Then, FIG. 1D shows a state in which a resist pattern 36 is formed on the surface of work according to a pattern shape of a wiring pattern to be formed on the surface of the core substrate 30. The resist pattern 36 is patterned so as to cover the surface of work with a resist film and expose a region used as the wiring pattern on the plated seed layer 34 by exposure and development.

Figure 2B:
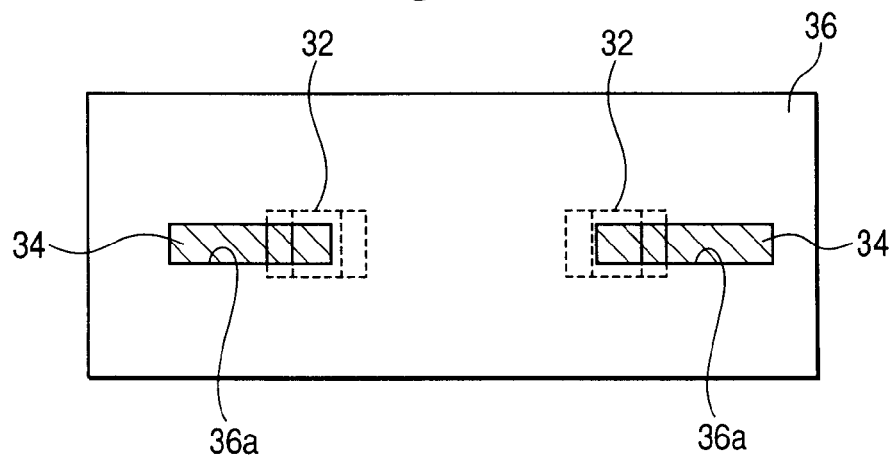

FIG. 2B shows a plan view of a state of forming the resist pattern 36 on the surface of the core substrate 30. A region in which the wiring pattern is formed among the surface of work is formed in exposed openings 36a in which the plated seed layer 34 is exposed to the bottom. The exposed openings 36a are formed so as to communicate (connect) from the surface of the core substrate 30 toward the side surfaces 32a and the tops 32b of the protrusions 32.

Figure 1E:
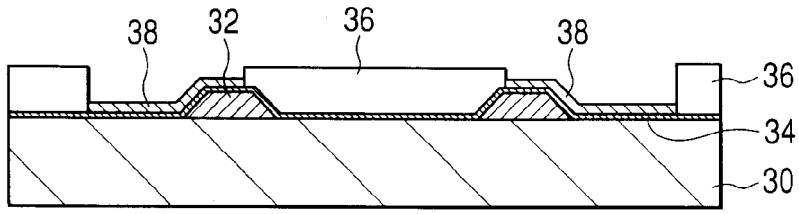
Figure 1F:
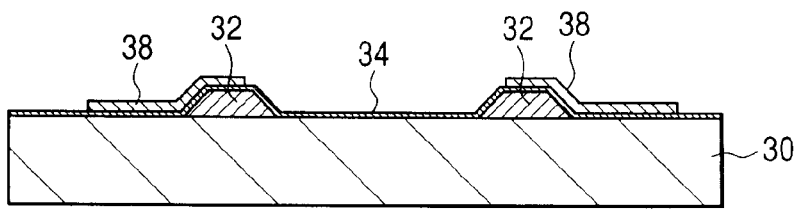

FIG. 1E shows a state in which electrolytic copper plating using the plated seed layer 34 as a plated power supplying layer is performed on the work and copper plating 38 is formed on a surface of the plated seed layer 34 of the inside of the exposed openings 36a.

Figure 1G:
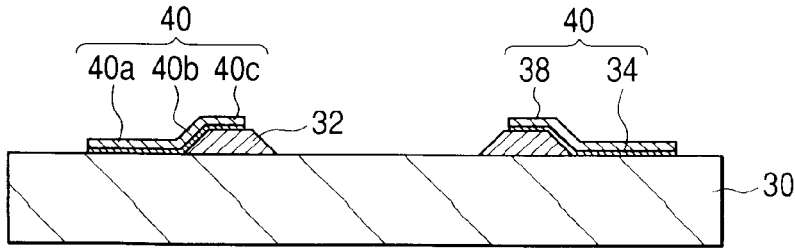

After the electrolytic copper plating is performed, the resist pattern 36 is removed (FIG. 1F) and then a region exposed to the surface of work of the plated seed layer 34 is removed (FIG. 1G). Since the plated seed layer 34 is much thinner than the copper plating 38, the exposed portion of the plated seed layer 34 can be selectively removed using etching liquid of copper without covering a region in which the copper plating 38 is deposited by a resist etc. By removing the exposed portion of the plated seed layer 34, wiring patterns 40 are maintained on the core substrate 30 as independent patterns.

Figure 2C:
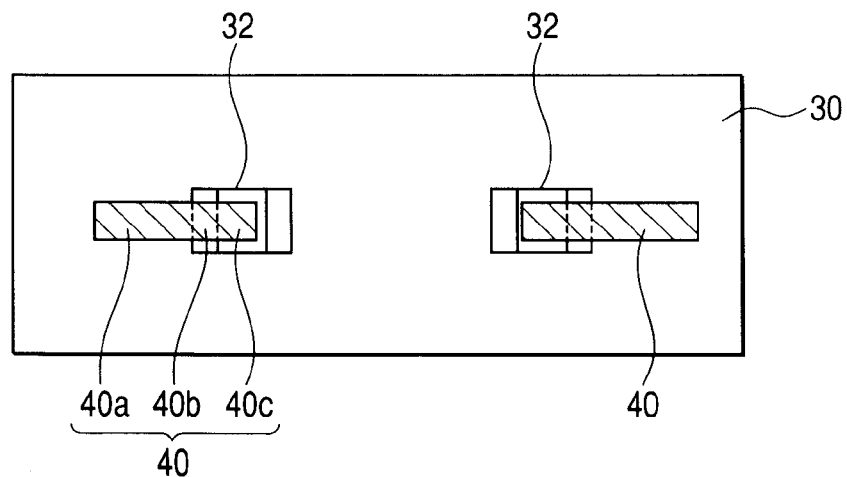

FIG. 2C shows a plan view of a state of forming the wiring patterns 40 on the core substrate 30. The wiring pattern 40 comprises a region 40a deposited on the surface of the core substrate 30, a conduction part 40b deposited on the side surface 32a of the protrusion 32 and a connection part 40c deposited on the top 32b of the protrusion 32. That is, the wiring pattern 40 is formed by extending wiring from the routed portion deposited on the surface of the core substrate 30 onto the top 32b of the protrusion 32, and the connection part 40c of the wiring pattern 40 is supported in a position much higher from the surface of the core substrate 30.

FIGS. 3A to 3F show steps of covering the surface of the core substrate 30 on which the wiring patterns 40 are formed with an insulating layer 60 and forming wiring patterns of the second layer on a surface of the insulating layer 60.

Figure 3A:
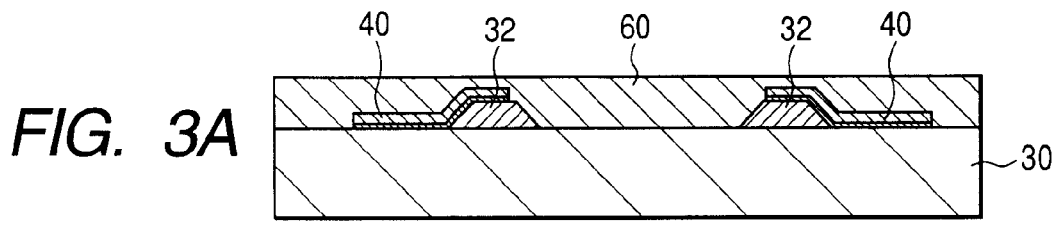
FIGS. 3A to 3F are sectional views of the substrate in manufacturing steps of the wiring substrate according to the present invention.

FIG. 3A shows a state of forming the insulating layer 60 so that the wiring patterns 40 formed on the surface of the core substrate 30 including the connection parts 40c deposited on the tops 32b of the protrusions 32 are buried in the insulating layer 60. The insulating layer 60 can be formed by a method for laminating an insulating film on the surface of work or a method for coating the surface of work with an insulating material.

Figure 3B:
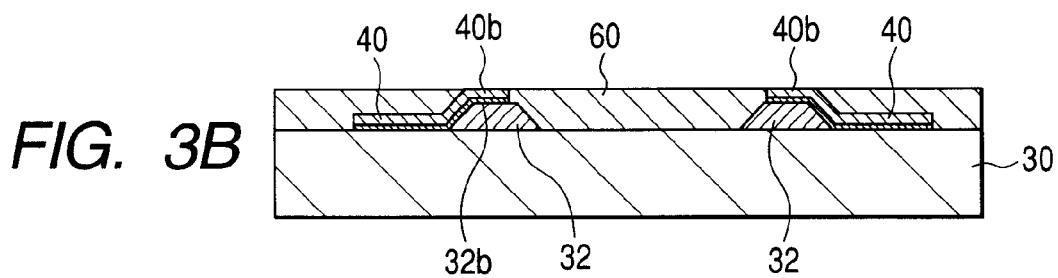

FIG. 3B shows a state of exposing surfaces of the connection parts 40c of the wiring patterns 40 deposited on the tops 32b of the protrusions 32 from the insulating layer 60. As a method for exposing the connection parts 40c deposited on the tops 32b of the protrusions 32 from the insulating layer 60, a method for performing dry etching in work, a method for polishing the surface of work, a method by a sand blast for spraying abrasive grains and removing a required region, etc. can be used. The connection parts 40c of the wiring patterns 40 can be exposed by removing an insulating resin with which the tops 32b of the protrusions 32 are covered by laser machining. Also, when an insulating resin for forming the insulating layer 60 is made of a photosensitive resin material, the surfaces of the connection parts 40c can be exposed by removing the insulating resin with which the tops 32b of the protrusions 32 are covered by exposure and development operations.

Figure 3C:
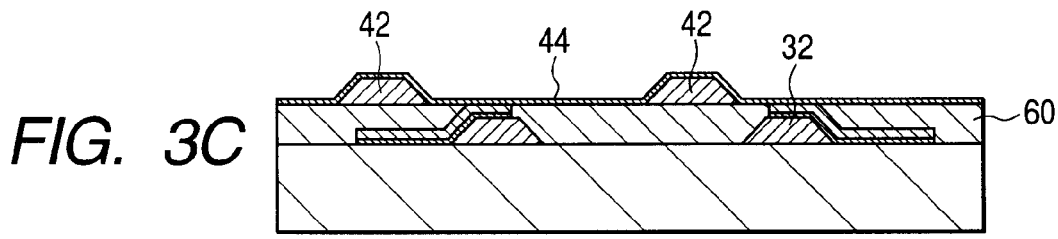

Then, protrusions 42 are formed on a surface of the insulating layer 60 in alignment with a planar arrangement position in which the wiring patterns of the second layer are electrically connected to wiring patterns of the third layer, and a plated seed layer 44 is formed on the whole surface of work (FIG. 3C). The protrusions 42 can be formed in a manner similar to the method for forming the protrusions 32 on the core substrate 30 described above.

Figure 3D:
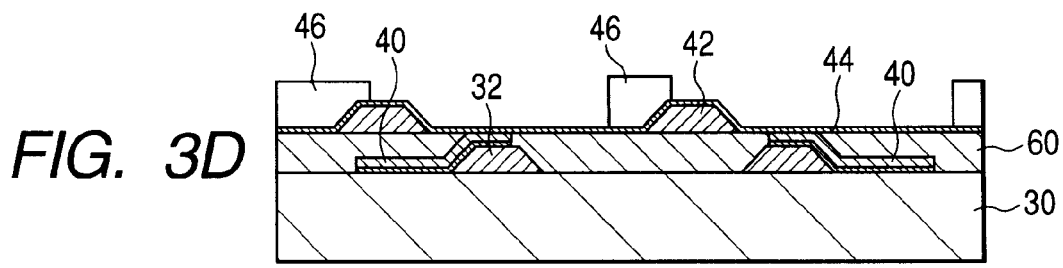
Figure 3E:
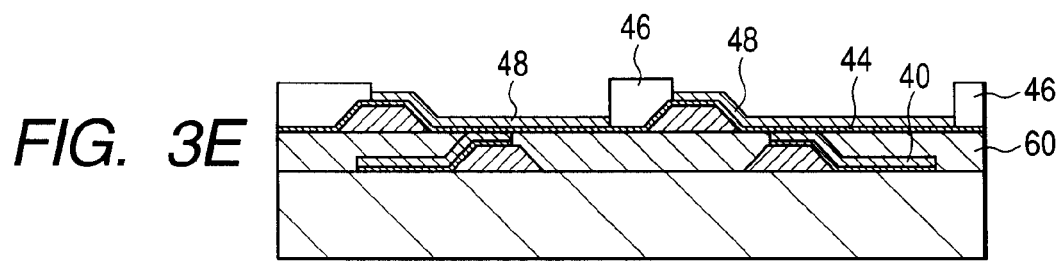

Then, a resist pattern 46 is formed according to arrangement of the wiring patterns formed on the surface of the insulating layer 60 (FIG. 3D). FIG. 3E is a state in which electrolytic copper plating using the plated seed layer 44 as a plated power supplying layer is performed and copper plating 48 is deposited on an exposed surface of the plated seed layer 44.

Figure 3F:
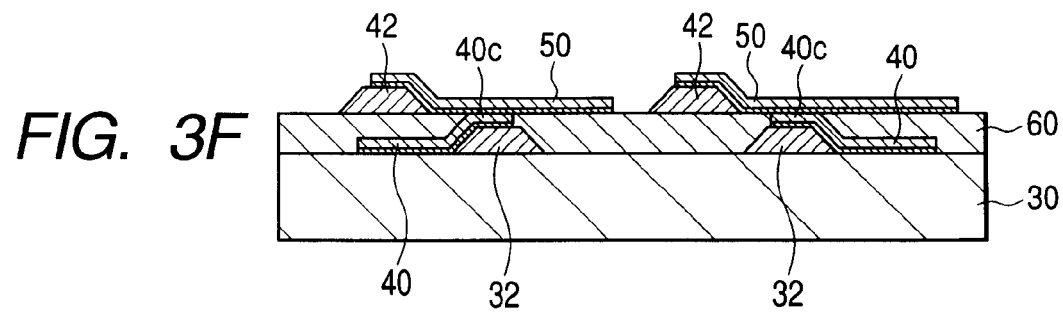

FIG. 3F shows a state of removing the resist pattern 46 and etching an exposed portion of the plated seed layer 44 and forming wiring patterns 50 of the second layer.

Since the connection parts 40c of the wiring patterns 40 formed on the protrusions 32 contact with the wiring patterns 50, the wiring patterns 40 of the first layer are electrically connected to the wiring patterns 50 of the second layer, and the wiring patterns 40 of the first layer and the second wiring patterns 50 are laminated and formed through the insulating layer 60.

Figure 4:
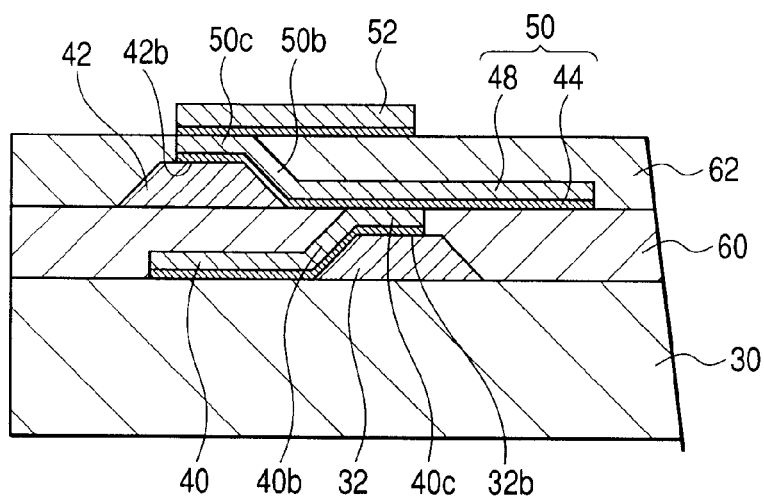
FIG. 4 is a sectional view of a wiring substrate formed by laminating wiring patterns in plural layers.

FIG. 4 shows a state of forming a wiring pattern 52 of the third layer on a surface of an insulating layer 62 after the wiring patterns 50 of the second layer are formed and then the insulating layer 62 is deposited and formed on the surface of work. A surface of a connection part 50c of the wiring pattern 50 deposited on the top of the protrusion 42 is exposed to the surface of the insulating layer 62 and the wiring pattern 52 of the third layer is electrically connected to the wiring pattern 50 of the second layer through the connection part 50c.

In a wiring substrate shown in FIG. 4, by forming the wiring patterns 40, 50 in a form of forming the protrusions 32, 42 on the surface of the core substrate 30 and the surface of the insulating layer 60 and extending wiring to the tops 32b, 42b of the protrusions 32, 42, the wiring patterns 40, 50, 52 of the adjacent layers are electrically connected by the connection part 40c and the connection part 50c.

A configuration in which the protrusions 32, 42 are formed much higher from the surfaces of the core substrate 30 and the insulating layer 60 and the wiring patterns 40, 50 of the lower layers are connected to the wiring patterns 50, 52 of the upper layers in positions in which the protrusions 32, 42 are formed indicates that the conduction parts 40b, 50b and the connection parts 40c, 50c formed on the protrusions 32, 42 function as a via for electrically connecting the wiring patterns between the layers.

Figure 5A:
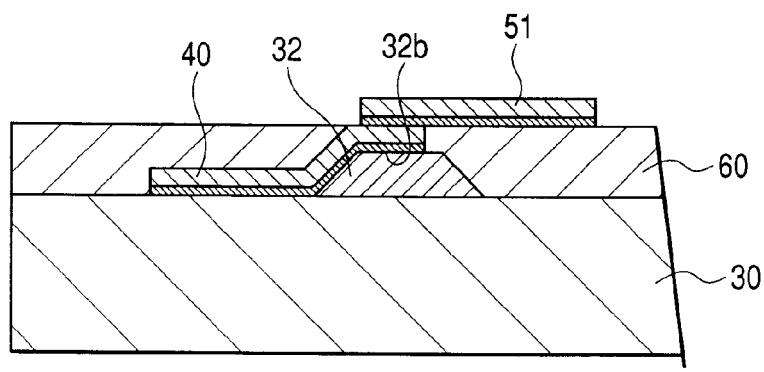
FIG. 5A is a sectional view of wiring patterns in a protrusion.
Figure 5B:
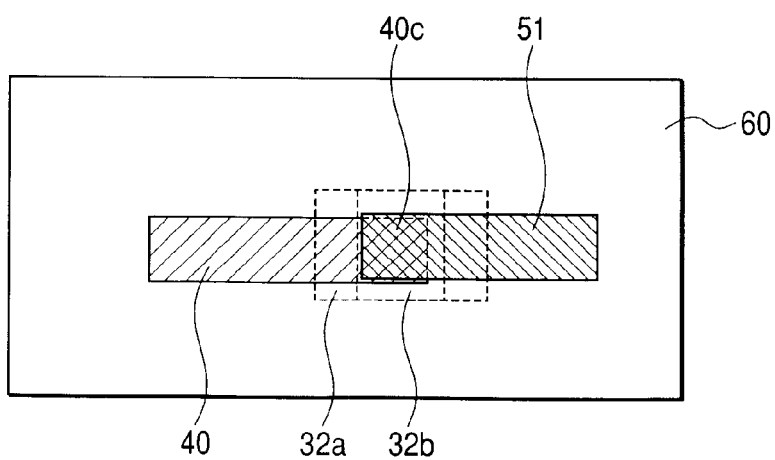
FIG. 5B is plan view of wiring patterns in a protrusion.
Figure 6A:
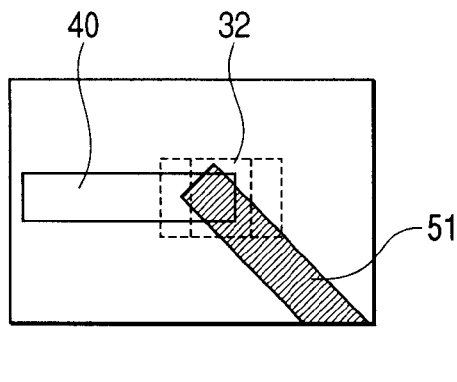
FIGS. 6A to 6F are explanatory diagrams showing planar connection forms of wiring patterns in a protrusion.
Figure 6B:
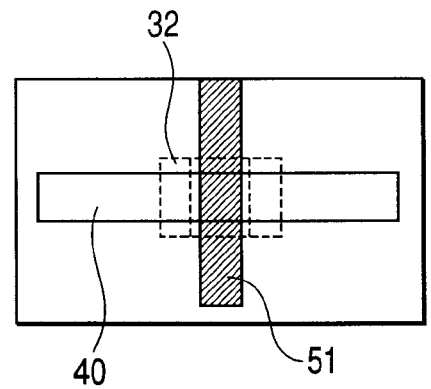
Figure 6C:
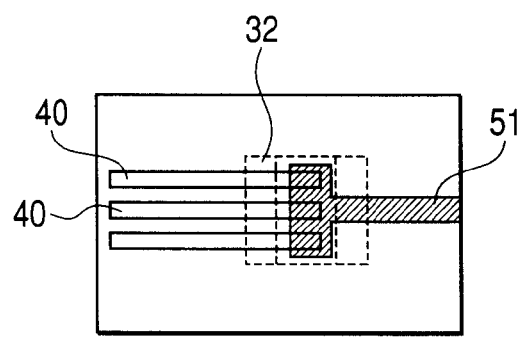
Figure 6D:
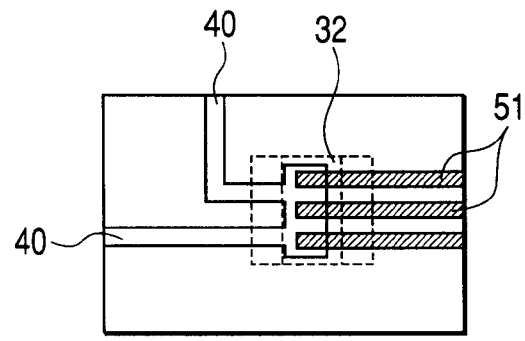
Figure 6E:
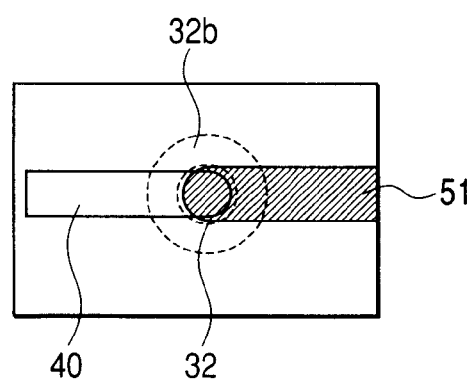
Figure 6F:
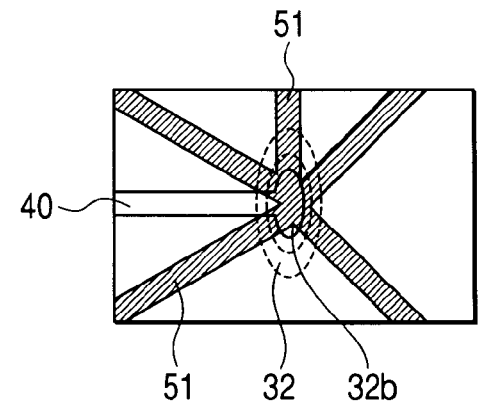

FIG. 5B shows planar arrangement of a wiring pattern 51 of the second layer and the wiring pattern 40 of the first layer in the protrusion 32 in a configuration of a wiring substrate of FIG. 5A. The wiring pattern 40 of the first layer is electrically connected to the wiring pattern 51 of the second layer by forming arrangement in which the wiring patterns overlap on the top 32b of the protrusion 32. The wiring pattern 51 could be patterned so as to be aligned with the connection part 40c exposed to the top 32b of the protrusion 32.

In the manufacturing method of the embodiment, electrical connection can be made by arranging the wiring patterns so that the wiring patterns overlap and intersect mutually using pattern widths of the wiring pattern of the lower layer and the wiring pattern of the upper layer.

FIG. 6 shows several examples of connection forms of making connection between the wiring pattern 40 of the lower layer and the wiring pattern 51 of the upper layer through the protrusion 32. FIG. 6A is an example of being formed so as to draw the wiring pattern 51 in an oblique direction from the top of the protrusion 32. FIG. 6B is an example in which the wiring pattern 40 of the lower layer is formed so as to cross the top of the protrusion 32 and the wiring pattern 51 of the upper layer is arranged in a perpendicular direction from the top of the protrusion 32. FIG. 6C is an example in which three wiring patterns 40 of the lower layer are connected to one protrusion 32 and these wiring patterns 40 are connected to one wiring pattern 51. FIG. 6D is an example in which two wiring patterns 40 of the lower layer are connected to three wiring patterns 51 of the upper layer by the protrusion 32. FIG. 6E is an example of forming the protrusion 32 with a circular planar shape, and FIG. 6F is an example of forming the protrusion 32 with an elliptic planar shape.

As shown in FIGS. 6A to 6F, the protrusion 32 is not limited to a rectangle, and can be formed in proper planar shapes such as an ellipse and in proper sizes.

Also, in the protrusion 32, a region for forming the conduction part 40b is formed in the inclined surface, but the side surface of the protrusion 32 must not be necessarily the inclined surface. As long as it is a form of making electrical connection between the connection part 40c and the other end side of the wiring pattern 40, a shape of the side surface of the protrusion 32 is not limited.

The reason why the top 32b of the protrusion 32 is formed in a flat surface is because an area for making connection to the wiring pattern in the top 32b of the protrusion 32 is ensured. When plural wiring patterns are connected in the top 32b of the protrusion 32, a size and a form of the top 32b of the protrusion 32 are designed properly.

As shown in FIGS. 6A to 6F, in a region in which the wiring patterns are connected in the protrusion 32, there is no need to form a pad for via connection as in the case of a form of making connection using a related-art via hole, and therefore the wiring pattern can be formed at a high density. Also, there is no need to form a wide portion like the pad for via connection in the middle of wiring, so that electrical characteristics of wiring can be improved. Also, there is no need to detour and arrange the wiring pattern so as not to interfere with a via pad, and a wiring length can be reduced and a substrate can also be miniaturized and it can be provided as a wiring substrate with good electrical characteristics.

In addition, in the manufacturing steps described above, the example of forming the wiring patterns 40, 50 by a semi-additive method has been shown, but the wiring patterns can also be manufactured by methods other than the semi-additive method. FIG. 7 shows a step example of manufacturing a wiring substrate by a subtractive method.

Figure 7A:
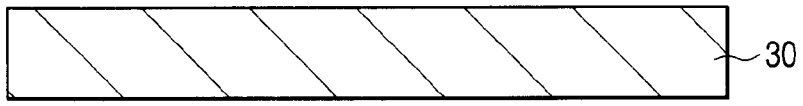
FIGS. 7A to 7F are sectional views of a substrate in other manufacturing steps of a wiring substrate.
Figure 7B:
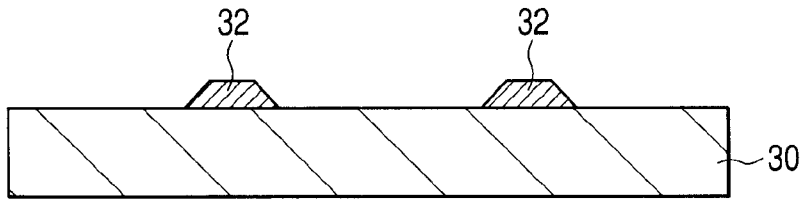
Figure 7C:
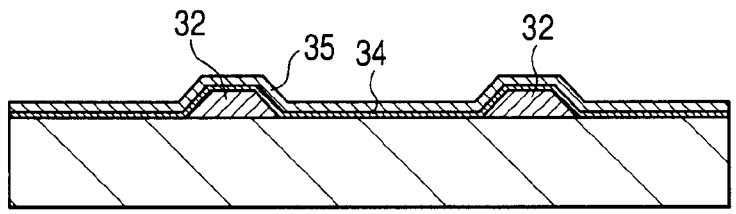
Figure 7D:
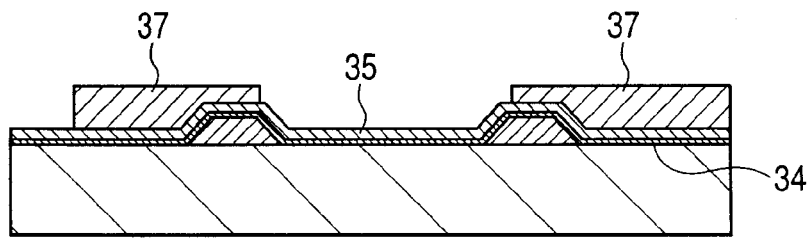

First, protrusions 32 are formed on a surface of a core substrate 30 (FIGS. 7A and 7B). Next, a plated seed layer 34 is formed on a surface of work, and electrolytic copper plating using the plated seed layer 34 as a plated power supplying layer is performed and copper plating 35 is deposited and formed on a surface of the plated seed layer 34 (FIG. 7C). Then, a resist pattern 37 is formed so as to cover a region used as wiring patterns 40 (FIG. 7D), and the wiring patterns 40 are formed on the core substrate 30 by etching the plated seed layer 34 and the copper plating 35 using the resist pattern 37 as a mask. The end of the wiring pattern 40 is formed with the end extending on a top of the protrusion 32, and results in a connection part 40c electrically connected to a wiring pattern of an upper layer (FIG. 7E).

Figure 7E:
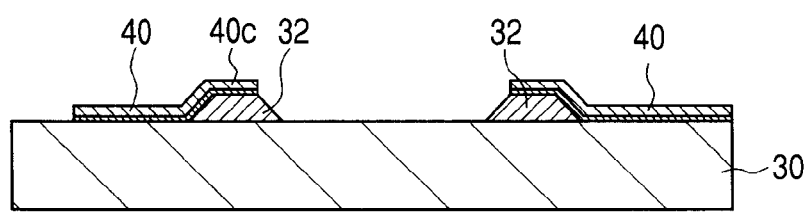

In the case of a wiring substrate comprising a wiring pattern of a single layer, it shows a state (FIG. 7F) of exposing a surface of the connection part 40c deposited on the top of the protrusion 32 to a surface of an insulating layer 60 by a dry etching method, a polishing method, a sand blast method after the surface of work is covered with a resin film or the surface of work is covered with the insulating layer 60 by resin coating from the state shown in FIG. 7E. As shown in the drawing, the wiring substrate of the exemplary embodiment is characterized in that the surface of the insulating layer 60 with which the surface of the substrate is covered is formed on a level with the surface of the connection part 40c. Also, when wiring patterns are formed on a wiring substrate in multi layers, the connection part 40c of a surface layer of the wiring substrate can be formed on a level with a surface of the insulating layer 60.

The wiring substrate according to the present invention is formed by forming the protrusion 32, 42 on the surface of the core substrate 30 or the insulating layer 60 and electrically connecting the wiring patterns between layers. Since these protrusions 32, 42 can be collectively formed by a printing method, a transfer method, etc., there are advantages that mass productivity is better and the manufacturing steps are simpler than a method for forming via holes one by one by laser machining in the related-art manner.

Also, according to the method of the present invention, the need for a step of plating via holes is eliminated, and there is an advantage capable of using a step of forming a related-art wiring pattern as it is when a wiring pattern is formed on the protrusion 32.

(Semiconductor Apparatus)

Figure 7F:
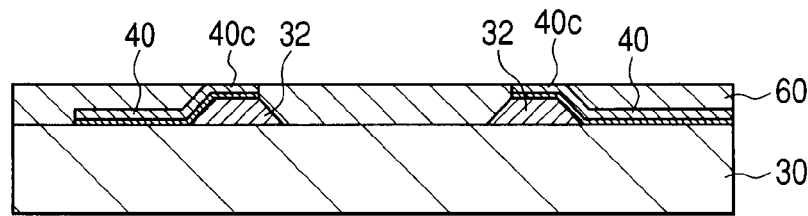

In a wiring substrate, the wiring pattern 40 can also be formed as a single layer as shown in FIG. 7F or the wiring patterns 40, 50, 52 can also be configured to be laminated by the insulating layers 60, 62 as shown in FIG. 4. A semiconductor apparatus is provided by mounting a semiconductor element or a required circuit component in these wiring substrates.

Figure 8A:
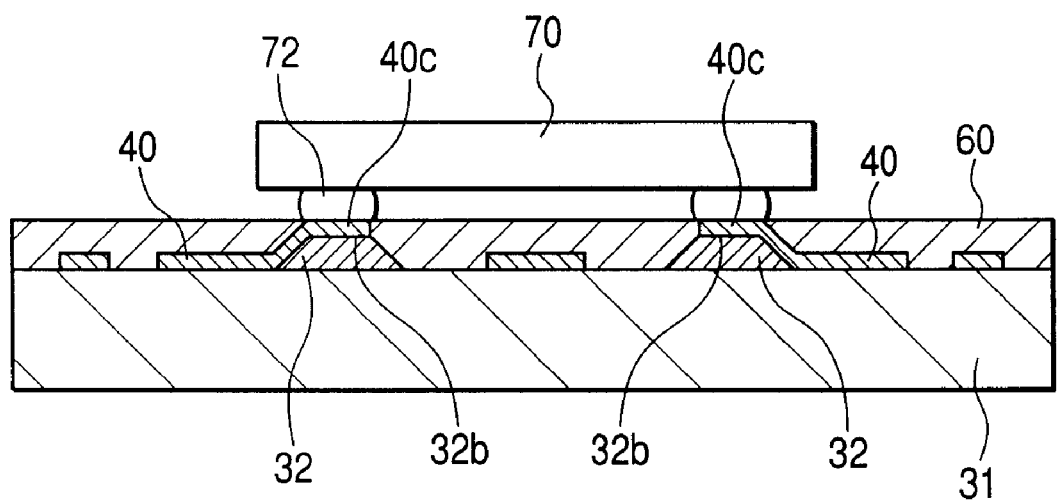
FIGS. 8A, 8B are sectional views showing a configuration example of a semiconductor apparatus according to the present invention.
Figure 8B:
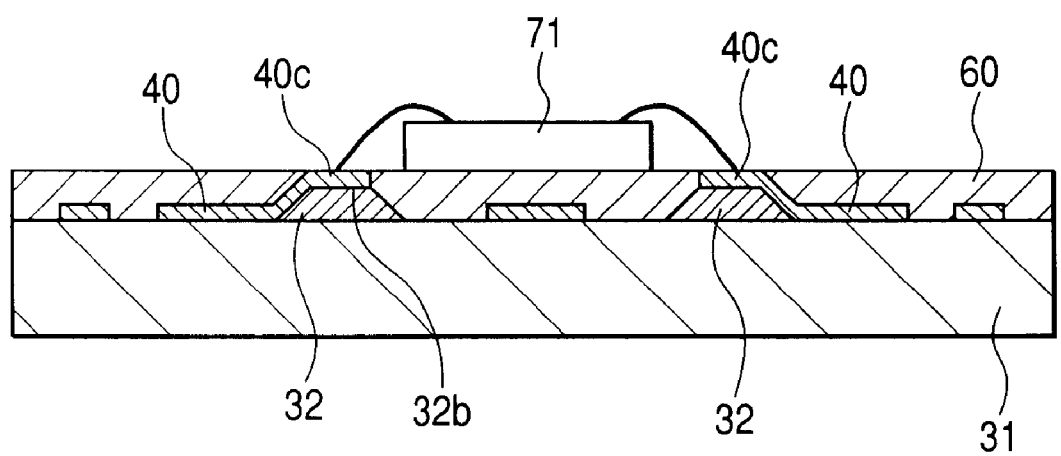
Figure 9A:
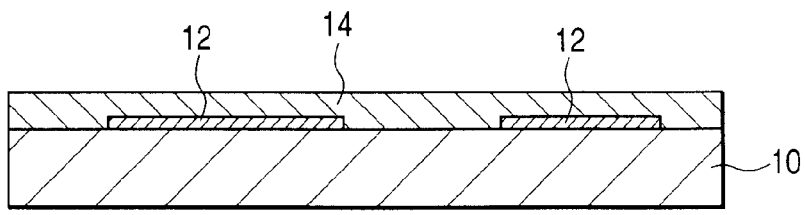
FIGS. 9A to 9E are explanatory diagrams showing a manufacturing method of a related-art wiring substrate.
Figure 9B:
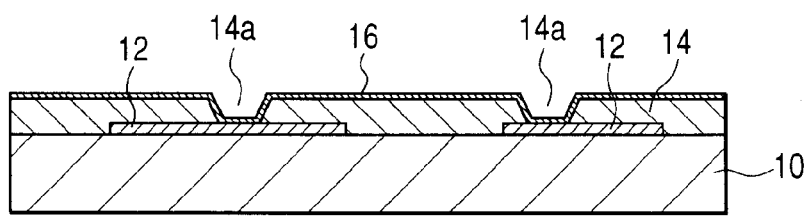
Figure 9C:
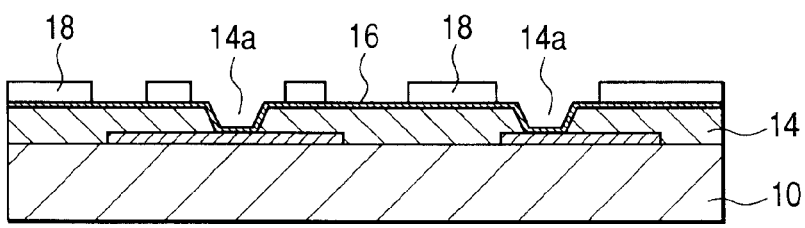
Figure 9D:
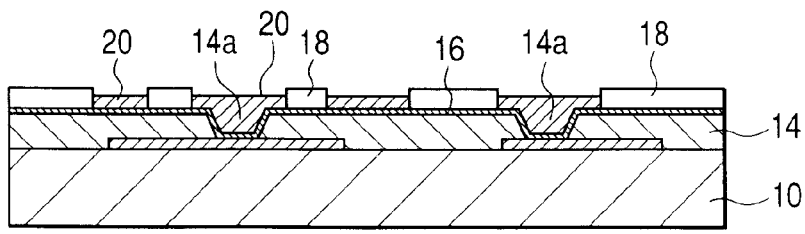
Figure 9E:
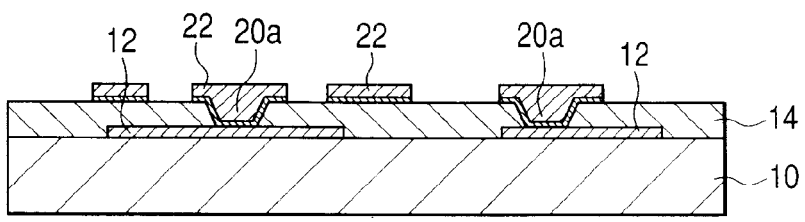
Figure 10A:
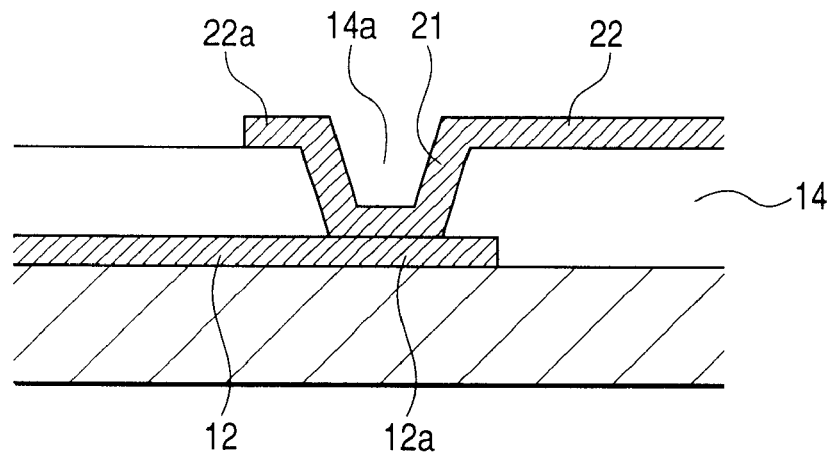
FIGS. 10A to 10C are explanatory diagrams showing a configuration of a connection portion of a via in the related-art wiring substrate.
Figure 10B:
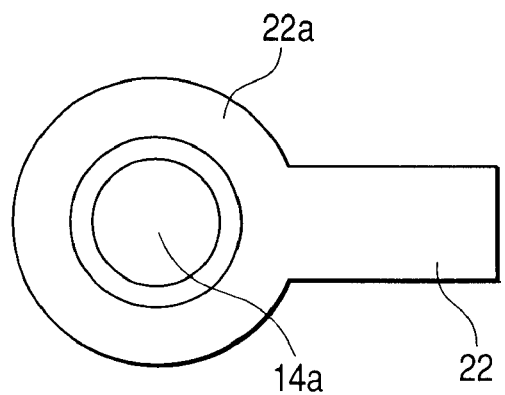
Figure 10C:
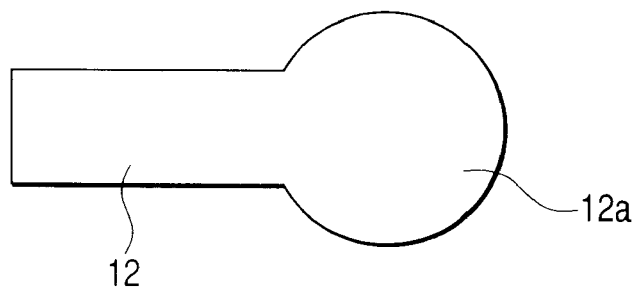
Figure 11A:
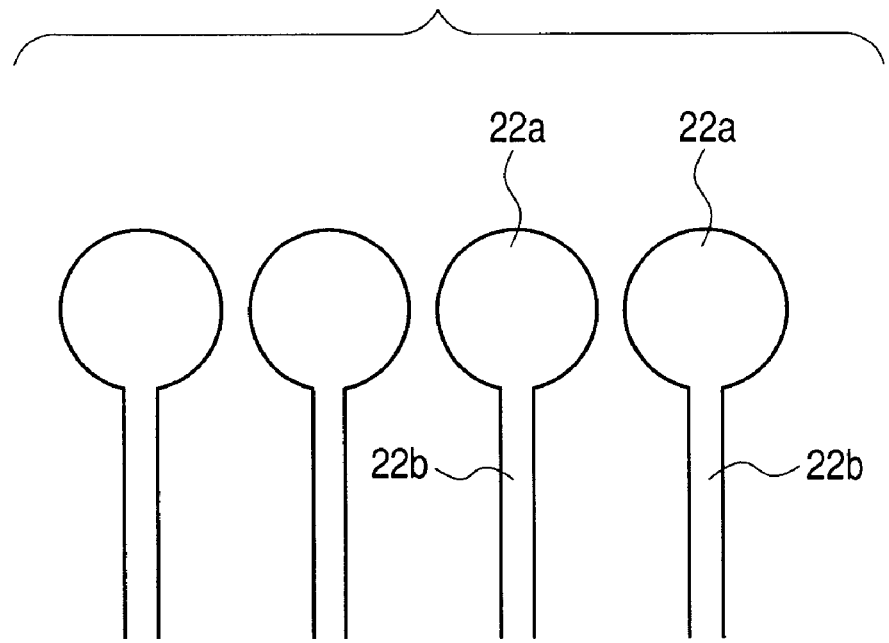
FIGS. 11A, 11B are explanatory diagrams showing an arrangement example of wiring and pads of a wiring pattern.
Figure 11B:
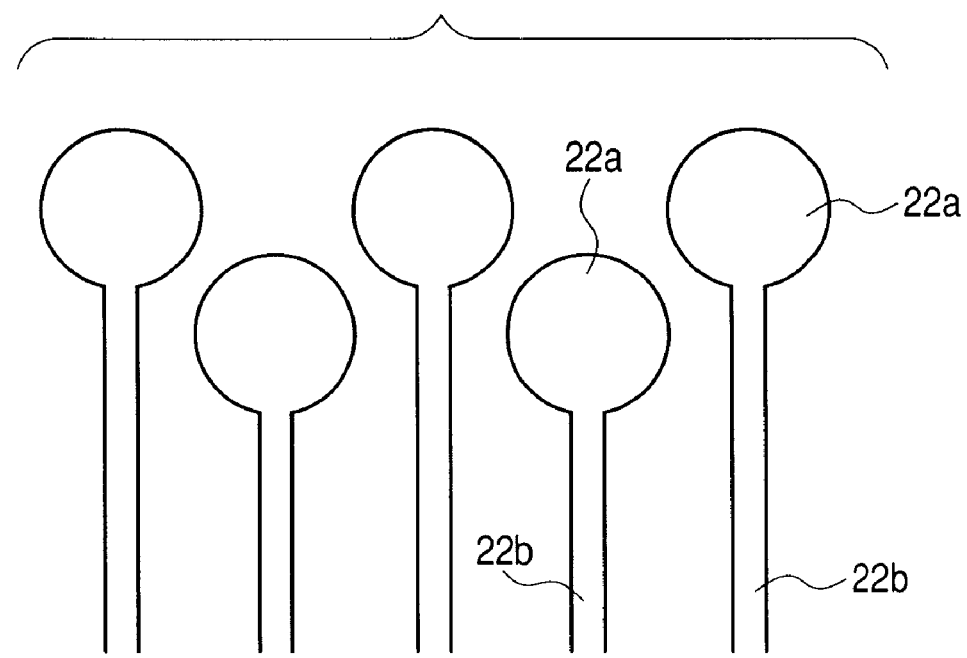

FIGS. 8A, 8B are exemplary examples of a semiconductor apparatus using the wiring substrate according to the present invention, and shows an example of a semiconductor apparatus in which a semiconductor element is mounted on a wiring substrate in which wiring patterns 40 of a single layer are formed. FIG. 8A shows an example of mounting a semiconductor element 70 on the wiring substrate by flip chip bonding, and FIG. 8B shows an example of mounting a semiconductor element 71 by wire bonding.

The wiring substrate used in the semiconductor apparatus of the present embodiment is formed so that the wiring patterns 40 are formed on a surface of a substrate 31 and also connection parts 40c are formed by extending the wiring patterns 40 onto tops 32b of protrusions 32 formed on the surface of the substrate 31 and surfaces on which the wiring patterns 40 of the substrate 31 are formed are covered with an insulating layer 60 and surfaces of the connection parts 40c are exposed on a level with a surface of the insulating layer 60.

In FIG. 8A, the connection parts 40c exposed to the surface of the insulating layer 60 of the wiring substrate are formed by matching a planar arrangement position with connection electrodes (connection bumps) of the semiconductor element 70. In FIG. 8B, the connection parts 40c exposed to the surface of the insulating layer 60 of the wiring substrate are formed as bonding pads connected to the semiconductor element 71 by wire bonding. In the wiring substrate shown in FIG. 8B, an area for mounting the semiconductor element 71 is ensured and the connection parts 40c are arranged in the periphery of its area.

In the semiconductor apparatus of the embodiment, mounting surfaces of the semiconductor elements 70, 71 of the wiring substrates on which the semiconductor elements 70, 71 are mounted are formed in flat surfaces, so that there is an advantage capable of surely mounting the semiconductor elements 70, 71.

In the case of mounting the semiconductor element by flip chip bonding, the fact that the connection parts 40c are formed as flat pads and a mounting surface of the semiconductor element is formed in a flat surface has advantages capable of increasing reliability of mounting of the semiconductor element and accurately bonding the connection electrodes of the semiconductor element to the pads in the case of mounting the semiconductor element in which the number of pins is particularly large.

Also, when a mounting surface of the wiring substrate is formed in a flat surface in the case of performing an underfill after flip chip bonding of the semiconductor element is made, flow characteristics of an underfill resin improve and the underfill resin can be filled so as not to cause a void and filling characteristics of the underfill resin can be improved. Since a bump diameter of the semiconductor element with many pins becomes small, a separation distance between the wiring substrate and the semiconductor element in the case of making the flip chip bonding becomes narrower. A method for improving the filling characteristics (flow characteristics) of the underfill resin by forming the mounting surface on which pads of the wiring substrate are formed in the flat surface is particularly effective in the case of mounting the semiconductor element with many pins.

In addition, in the case of considering fluidity of the underfill resin in a mounting surface of the semiconductor element of the wiring substrate, it is not preferable that the surfaces of the connection parts 40c used as pads in the mounting surface of the wiring substrate protrude beyond the surface of the insulating layer 60. It is preferable that the surfaces of the connection parts 40c be in a position lower than the surface of the insulating layer 60. Also in the case of considering fluidity (filling characteristics) of the underfill resin in this case, it is desirable that a step difference between the surface of the insulating layer 60 and the surfaces of the connection parts 40c be about 5 µm or less.

Also, when the protrusions 32 formed on the wiring substrate are formed by flexible raw materials, thermal stress occurring by a thermal expansion coefficient difference between the substrate 31 and the semiconductor element 70, 71 can be reduced by the protrusions 32 and it can also be constructed so that the semiconductor element is not damaged by the thermal stress.

In addition, in the exemplary embodiment described above, the example of mounting the semiconductor element on the wiring substrate has been shown, but a previously packaged semiconductor device instead of the semiconductor element, for example, CSP (Chip Size Package), BGA (Ball Grid Array) or MCM (Multi Chip Module) can also be mounted on the wiring substrate. In this case, a connection part 40c of the wiring substrate and the semiconductor device on which the semiconductor element is mounted can be bonded and mounted through a connection terminal such as a solder ball.

While the present invention has been described with respect to a limited number of embodiments, those skilled in the art, having benefit of this disclosure, will appreciate that other embodiments can be devised which do not depart from the scope of the present invention as disclosed herein. Accordingly, the scope of the present invention should be limited only by the attached claims.

What is claimed is:
1. A semiconductor apparatus comprising:
a resin substrate;
a protrusion formed on a surface of the substrate;
a wiring pattern formed on the surface of the substrate by extending wiring onto a top of the protrusion;
an insulating layer covering the surface of the substrate on which the wiring pattern is formed;
a semiconductor element disposed over said insulating layer; and,
an under fill resin, wherein said under fill resin is provided between the insulating layer and the semiconductor element;
wherein only a surface of a connection part of the wiring pattern disposed on the top of the protrusion is exposed to a surface of the insulating layer and the surface of the connection part is on a level with the surface of the insulating layer, said connection part being a pad portion that is electrically connected to said semiconductor element by flip-chip bonding.

2. The semiconductor apparatus as claimed in claim 1, wherein a side surface of the protrusion is formed in an inclined surface and the wiring pattern extends to the connection part through the inclined surface.

3. The semiconductor apparatus as claimed in claim 1, wherein
said protrusion has a top surface with a first portion and a second portion, a first inclined side surface extending between the surface of the substrate and the first portion of the top surface, and a second inclined side surface extending between the surface of the substrate and the second portion of the top surface,
said wiring pattern is formed on the surface of the substrate by extending wiring from the surface of the substrate, along only the first inclined side surface of the protrusion, to only the first portion of the top surface of the protrusion.

4. The semiconductor apparatus as claimed in claim 1, wherein a height difference between the surface of the connection part and the surface of the insulating layer is 5 μm or less.

5. A manufacturing method of a semiconductor apparatus, comprising the steps of:

forming a protrusion on a surface of a substrate;

forming a wiring pattern on the surface of the substrate on which the protrusion is formed by extending wiring onto a top of the protrusion;

covering the surface of the substrate on which the wiring pattern is formed with an insulating layer;

exposing a surface of a connection part of the wiring pattern disposed on the top of the protrusion to a surface of the insulating layer so that the surface of the connection part is on a level with the surface of the insulating layer or in a position lower than the surface of the insulating layer;

mounting a semiconductor element to the insulating layer;

connecting the exposed surface of the connection part, which serves as a pad portion, to the semiconductor element by flip-chip bonding; and, forming an under fill resin between the insulating layer and the semiconductor element.

6. The manufacturing method as claimed in claim 5, wherein a height difference between the surface of the connection part and the surface of the insulating layer is 5 μm or less.

\* \* \* \* \*